US011295196B2

(12) United States Patent
Chen et al.

(10) Patent No.: US 11,295,196 B2
(45) Date of Patent: Apr. 5, 2022

(54) APPARATUS AND METHODS FOR NEURAL NETWORK OPERATIONS SUPPORTING FIXED POINT NUMBERS OF SHORT BIT LENGTH

(71) Applicant: Cambricon Technologies Corporation Limited, Beijing (CN)

(72) Inventors: Yunji Chen, Beijing (CN); Shaoli Liu, Beijing (CN); Qi Guo, Beijing (CN); Tianshi Chen, Beijing (CN)

(73) Assignee: CAMBRICON TECHNOLOGIES CORPORATION LIMITED, Beijing (CN)

( * ) Notice: Subject to any disclaimer, the term of this patent is extended or adjusted under 35 U.S.C. 154(b) by 594 days.

(21) Appl. No.: 16/174,100

(22) Filed: Oct. 29, 2018

(65) Prior Publication Data

US 2019/0122094 A1   Apr. 25, 2019

Related U.S. Application Data

(63) Continuation-in-part of application No. PCT/CN2016/081839, filed on May 12, 2016.

(30) Foreign Application Priority Data

Apr. 29, 2016  (CN) .......................... 201610282480.4

(51) Int. Cl.
  *G06N 3/02* (2006.01)
  *G06F 9/44* (2018.01)
  *G06F 7/483* (2006.01)
(52) U.S. Cl.
  CPC .............. *G06N 3/02* (2013.01); *G06F 7/483* (2013.01); *G06F 9/44* (2013.01)

(58) Field of Classification Search
  CPC ....................................................... G06N 3/02
  See application file for complete search history.

(56) References Cited

U.S. PATENT DOCUMENTS

| 6,144,977 | A | * | 11/2000 | Giangarra | ............... | H03M 5/00 |
| | | | | | | 341/50 |
| 2012/0215822 | A1 | * | 8/2012 | Nystad | .................... | G06F 7/499 |
| | | | | | | 708/204 |

(Continued)

FOREIGN PATENT DOCUMENTS

| CN | 101419245 A | 4/2009 |
| CN | 102981854 A | 3/2013 |
| WO | WO 2017/185412 A1 | 11/2017 |

OTHER PUBLICATIONS

T. Chen, et al., "A Small-Footprint Accelerator for Large-Scale Neural Networks", ACM Transactions on Computer Systems, vol. 33, No. 2, Article 6, May 2015, 27 pages.

(Continued)

*Primary Examiner* — Olisa Anwah
(74) *Attorney, Agent, or Firm* — Getech Law LLC; Jun Ye

(57) ABSTRACT

Aspects for neural network operations with fixed-point number of short bit length are described herein. The aspects may include a fixed-point number converter configured to convert one or more first floating-point numbers to one or more first fixed-point numbers in accordance with at least one format. Further, the aspects may include a neural network processor configured to process the first fixed-point numbers to generate one or more process results.

22 Claims, 7 Drawing Sheets

(56) References Cited

U.S. PATENT DOCUMENTS

| | | | | |
|---|---|---|---|---|
| 2012/0242848 | A1* | 9/2012 | Hirayama | H03M 7/24 348/208.6 |
| 2015/0310311 | A1* | 10/2015 | Shi | G06F 15/8023 382/158 |
| 2016/0092169 | A1* | 3/2016 | Lutz | G06F 7/485 708/205 |
| 2017/0061279 | A1* | 3/2017 | Yang | G06N 3/084 |

OTHER PUBLICATIONS

Z. Du, et al., "An Accelerator for High Efficient Vision Processing", IEEE Transactions on Computer-aided Design of Integrated Circuits and System, vol. 36, No. 2, Feb. 2017, pp. 227-240.

S. Liu, et al., "Cambricon: An Instruction Set Architecture for Neural Networks", 2016 ACM/IEEE 43rd Annual International Symposium on Computer Architecture, Oct. 12, 2016, pp. 393-405.

S. Zhang, et al., "Cambricon-X" An Accelerator for Sparse Neural Networks, The 49th Annual IEEE/ACM International Symposium on Microarchitecture Article No. 20, Oct. 15, 2016, 12 pages.

Y. Chen, et al., "DaDianNao: A Machine-Learning Supercomputer", 2014 47th Annual IEEE/ACM International Symposium on Microarchitecture, Dec. 13, 2014, pp. 609-622.

T. Luo, et al., "DaDianNao: A Neural Network Supercomputer", IEEE Transaction on Computers, vol. 66, No. 1, Jan. 2017, pp. 73-88.

T. Chen, et al., "DianNao: A Small-Footprint High-Throughput Accelerator for Ubiquitous Machine-Learning", ASPLOS '14, Proceedings of the 19th international conference on Architectural support for programming languages and operating systems, Feb. 24, 2014, pp. 269-283.

Y. Chen, et ai., "DianNao Family: Energy-Efficient Hardware Accelerators for Machine Learning", Communications of the ACM, vol. 59, No. 11, Nov. 2016, pp. 105-112.

D. Liu, et al., "PuDianNao: A Polyvalent Machine Learning Accelerator", ASPLOS '15 Proceedings of the Twentieth International Conference on Architectural Support for Programming Languages and Operating Systems, Mar. 14, 2015, pp. 369-381.

Z. Du, et al., "ShiDianNao: Shifting Vision Processing Closer to the Sensor", ISCA '15 Proceedings of the 42nd Annual International Symposium on Computer Architecture, Jun. 13, 2015, pp. 92-104.

EP 16899923.3—European Search Report, dated Dec. 12, 2019, 5 pages.

Fang Fang, et al., "Lightweight Floating-Point Arithmetic: Case Study of Inverse Discrete Cosine Transform", Eurasip Journal on Advances in Signal Processing, Jan. 2, 2002, 13 pages.

Matthieu Courbariaux, et al., "Training Deep Neural Networks with Low Precision Multiplications", ICLR 2015, 10 pages.

Suyog Gupta, et al., "Deep Learning with Limited Numerical Precision", IBM Almaden Research Center, Feb. 9, 2015, 10 pages.

EP 16899923.3—Communication Pursuant to Article 94(3) EPC, dated Aug. 26, 2020, 5 pages.

EP 16899923.3—Response Communication Pursuant to Article 94(3) EPC, filed Nov. 10, 2020, 90 pages.

CN 201610282480.4—First Office Action, dated Jul. 15, 2020, 5 pages. (no English translation).

PCT/CN2016/081839—International Search Report, dated Feb. 6, 2017, 13 pages. (no English translation).

Application No. 201910152660.4—Office Action dated Sep. 23, 2019, 12 pages, (no English translation).

Yang, et al., "Research of Artificial Neural Network Arithmetic Based on FPGA", 2009, 6 pages. (with English translation).

EP 16 899 923.3—Communication pursuant to Article 94(3) EPC, 5 pages.

EP 16 899 923.3—Communication pursuant to Article 94(3) EPC, dated Feb. 11, 2022, 5 pages.

\* cited by examiner

APPARATUS AND METHODS FOR NEURAL NETWORK OPERATIONS SUPPORTING FIXED POINT NUMBERS OF SHORT BIT LENGTH

CROSS-REFERENCE TO RELATED APPLICATIONS

The present invention is a continuation-in-part of PCT Application No. PCT/CN2016/081839, filed on May 12, 2016, which claims priority to commonly owned CN Application No. 201610282480.4, filed on Apr. 29, 2016. The entire contents of each of the aforementioned applications are incorporated herein by reference.

BACKGROUND

High dynamic range computing has become increasingly important in applications of various fields recently. A bit length may refer to a given length of bits that are used to represent a data group hereinafter. As a result, floating-point number processors are often implemented as a part of a primary processor or as a coprocessor for the primary processor.

Conventionally, general-purpose processors are often configured to perform computations of floating-point numbers. However, general-purpose processors may be limited to computing floating-point numbers of a single format. One single format may be sufficient for some applications in terms of accuracy and dynamic range but it might not be necessary for other applications. For example, neural network algorithms may not require a high accuracy for floating-point numbers with an exponent field of a greater bit length but may prefer a high accuracy for floating-point numbers with a smaller exponent (weights or the weight variables and gradients in backward propagation algorithm). In the example of neural network algorithms, activation functions such as sigmoid function and tan h function are non-linear and, thus, input data with different levels of accuracy do not show significant difference after treated by activation functions. Therefore, the input data represented in floating-point numbers of high accuracy may cause unnecessary power consumption.

The implementation of floating-point numbers may result in more complicated computations. Thus, a solution that may speed up floating-point number computations while lowering power consumption has become a key issue in hardware design.

SUMMARY

The following presents a simplified summary of one or more aspects to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

One example aspect of the present disclosure provides an example apparatus for neural network operations with fixed-point number of short bit length. The example apparatus may include a fixed-point number converter configured to convert one or more first floating-point numbers to one or more first fixed-point numbers in accordance with at least one format. The example apparatus may further include a neural network processor configured to process the first fixed-point numbers to generate one or more process results.

Another example aspect of the present disclosure provides an example method for neural network operations with fixed-point number of short bit length. The example method may include converting, by a fixed-point number converter, one or more floating-point numbers to one or more fixed-point numbers in accordance with at least one format; and processing, by a neural network processor, the fixed-point numbers to generate one or more process results.

To the accomplishment of the foregoing and related ends, the one or more aspects comprise the features herein after fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Various aspects are now described with reference to the drawings. In the following description, for purpose of explanation, numerous specific details are set forth in order to provide a thorough understanding of one or more aspects. It may be evident, however, that such aspect(s) may be practiced without these specific details.

In the present disclosure, the term "comprising" and "including" as well as their derivatives mean to contain rather than limit; the term "or", which is also inclusive, means and/or.

In this specification, the following various embodiments used to illustrate principles of the present disclosure are only for illustrative purpose, and thus should not be understood as limiting the scope of the present disclosure by any means.

The following description taken in conjunction with the accompanying drawings is to facilitate a thorough understanding to the illustrative embodiments of the present disclosure defined by the claims and its equivalent. There are specific details in the following description to facilitate understanding. However, these details are only for illustrative purpose. Therefore, persons skilled in the art should understand that various alternation and modification may be made to the embodiments illustrated in this description without going beyond the scope and spirit of the present disclosure. In addition, for clear and concise purpose, some known functionality and structure are not described. Besides, identical reference numbers refer to identical function and operation throughout the accompanying drawings.

Figure 1:
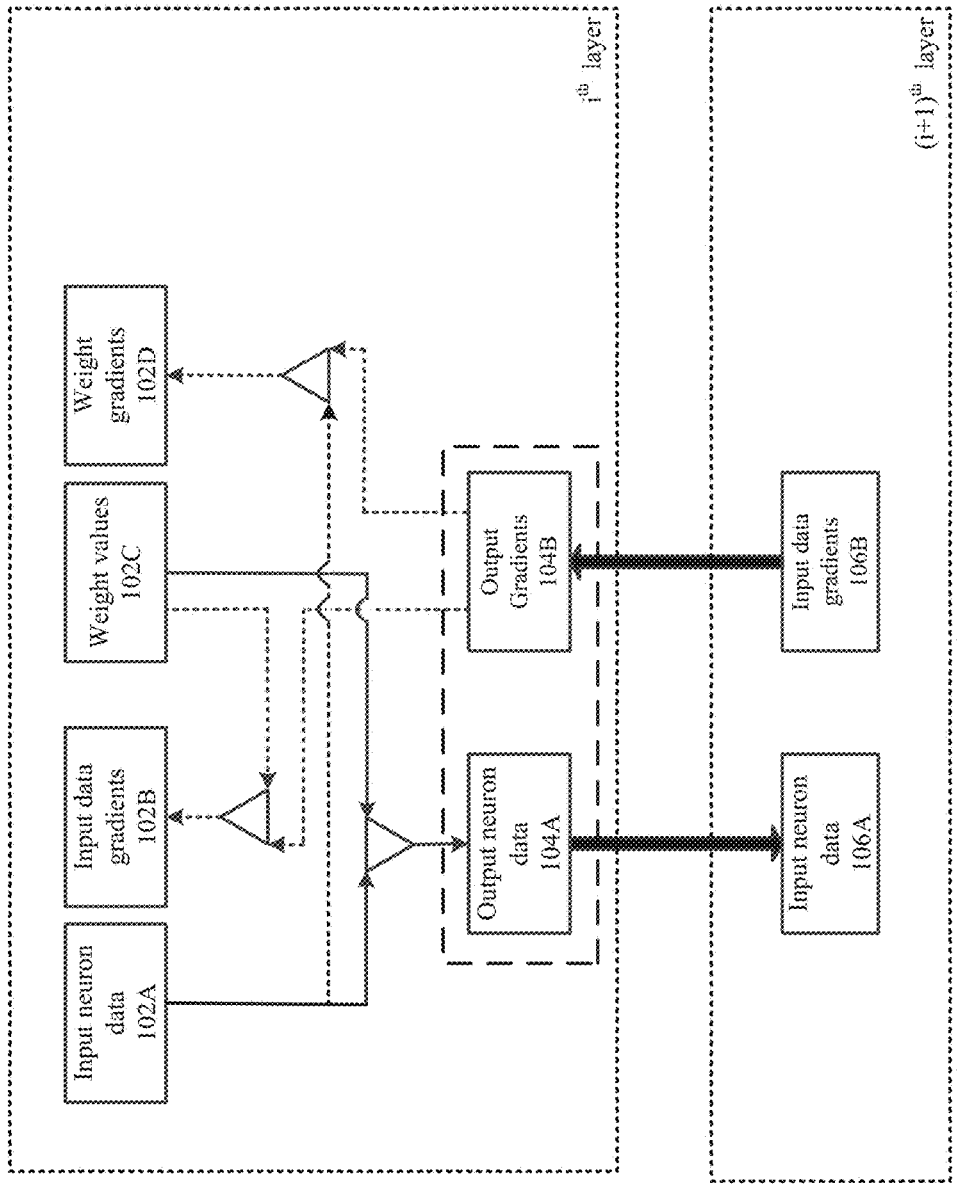
FIG. 1 is a block diagram illustrating an example forward propagation process and an example backpropagation process in a neural network.

FIG. 1 is a block diagram illustrating an example forward propagation process and an example backpropagation process (collectively, computing process 100) in a neural network. The computing process 100 is a merely example showing neural network operations that involve input data and weight values and is not limited to such operations. For example, other unshown neural network operations may include pooling operations, etc. Since convolution operation may be a major operation in the computing process 100, the illustrated multilayer neural network may be also referred to as a convolutional neural network.

As depicted, the example computing process 100 may be performed from the $i^{th}$ layer to the $(i+1)^{th}$ layer. The term "layer" here may refer to a group of operations, rather than a logic or a physical layer. A triangular-shaped operator (Δ as shown in FIG. 1) may indicate one or more neural network operations. Examples of the neural network operations may include an activation function, a bias operation, a matrix multiplication, a convolution operation, or any combination thereof. It is notable that the illustrated layers of operations may not be the first layer and the last layer of the entire computing process. Rather, the layers of operations may refer to any two consecutive layers in a neural network. As described below in greater detail, the computing process from the $i^{th}$ layer to the $(i+1)^{th}$ layer may be referred to as a forward propagation process; the computing process from $(i+1)^{th}$ layer to the $i^{th}$ layer may be referred to as a backward propagation (also may be interchangeably referred to as backpropagation) process.

The forward propagation process may start from input neuron data received at the $i^{th}$ layer (e.g., input neuron data 102A). Hereinafter, input neuron data may refer to the input data at each layer of operations, rather than the input data of the entire neural network. Similarly, output neuron data may refer to the output data at each layer of operations, rather than the output data of the entire neural network.

The received input neuron data 102A may be multiplied or convolved by one or more weight values 102C. The weight values 102C, stored as weight vectors, may also be referred to as a convolution kernel. The results of the multiplication or convolution may be transmitted as output neuron data 104A. In some examples, an activation function may be applied to the output neuron data 104A. The output neuron data 104A may be transmitted to the next layer (e.g., the $(i+1)^{th}$ layer) as input neuron data 106A. The forward propagation process may be shown as the solid lines in FIG. 1.

The backward propagation process may start from the last layer of the forward propagation process. For example, the backward propagation process may include the process from the $(i+1)^{th}$ layer to the $i^{th}$ layer. During the process, the input data gradients 106B may be transmitted to the $i^{th}$ layer as output gradients 104B. The output gradients 104B may then be multiplied or convolved by the input neuron data 102A to generate weight gradients 102D. Additionally, the output gradients 104B may be multiplied by the weight values 102C to generate input data gradients 102B.

Data in the computing process 100 may be floating-point numbers. The floating-point numbers may be represented as $(-1)^S \times (1+M) \times 2^E$, in which S denotes the sign of the corresponding floating-point number, M denotes the mantissa of the corresponding floating-point number, and E denotes the exponent of the corresponding floating-point number.

Different types of floating-point numbers at different layers of the computing process 100 may be of different accuracy. For example, most of the input neuron data 102A in the ith layer may be around $1.0 \times 2^{-4}$ and most of the weight values in the ith layer may be around $1.0 \times 2^{-8}$. Most of the input neuron data 106A in the (i+1)th layer may be, for example, between $1.0 \times 2^{-10}$ to $2.0 \times 2^{-9}$. Thus, fixed-point numbers may be sufficient to represent some types of data at the different layers of the computing process 100. For example, fixed-point numbers with 2 bits of integer and 5 bits of fraction may be sufficient for the input neuron data 102A in the $i^{th}$ layer.

In some examples, the data in the computing process 100 may be categorized based on the different types and the different layers. A format of fixed-point numbers may be determined for each category of the floating-point numbers. Each format may include a sign bit, a bit length limit of the integer, a bit length limit of the fraction, and a point location that indicates the location of a binary point. For example, a fixed-point number represented as fixed<8,3> may indicate that the entire bit length of the fixed-point number is 8 bit and the binary point is located between the third bit and the fourth bit from the least significant bit. In other words, the bit length for the fraction is 3 bits.

Figure 2:
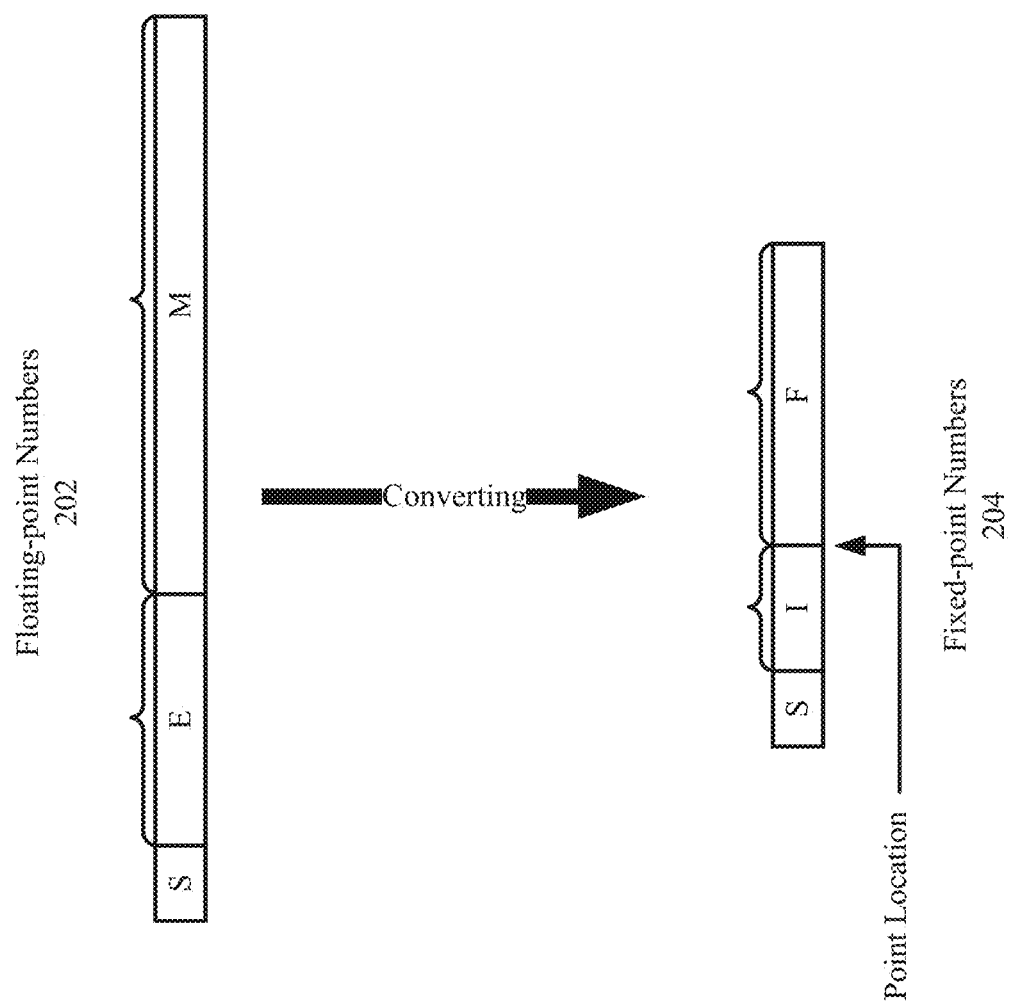
FIG. 2 is a block diagram illustrating an example converting process between floating-point numbers and fixed-point numbers.

FIG. 2 is a block diagram illustrating an example converting process between floating-point numbers and fixed-point numbers.

As depicted, floating-point numbers 202 may include one sign bit, one or more bits for the exponent field, and one or more bits for the mantissa field. For example, the format of a 32-bit floating-point number of IEEE754 standard may include one sign bit, eight bits for the exponent field, and twenty-three bits for the mantissa field. The floating-point numbers 202 may be converted into fixed-point numbers in accordance with one or more formats determined based on the type of the data and the layers of operations, in which the data is processed or generated.

The fixed-point numbers 204, as shown, may include a sign bit, one or more bits for the integer (collectively shown as "I"), one or more bits for the fraction (collectively shown as "F"), and a point location.

Figure 3:
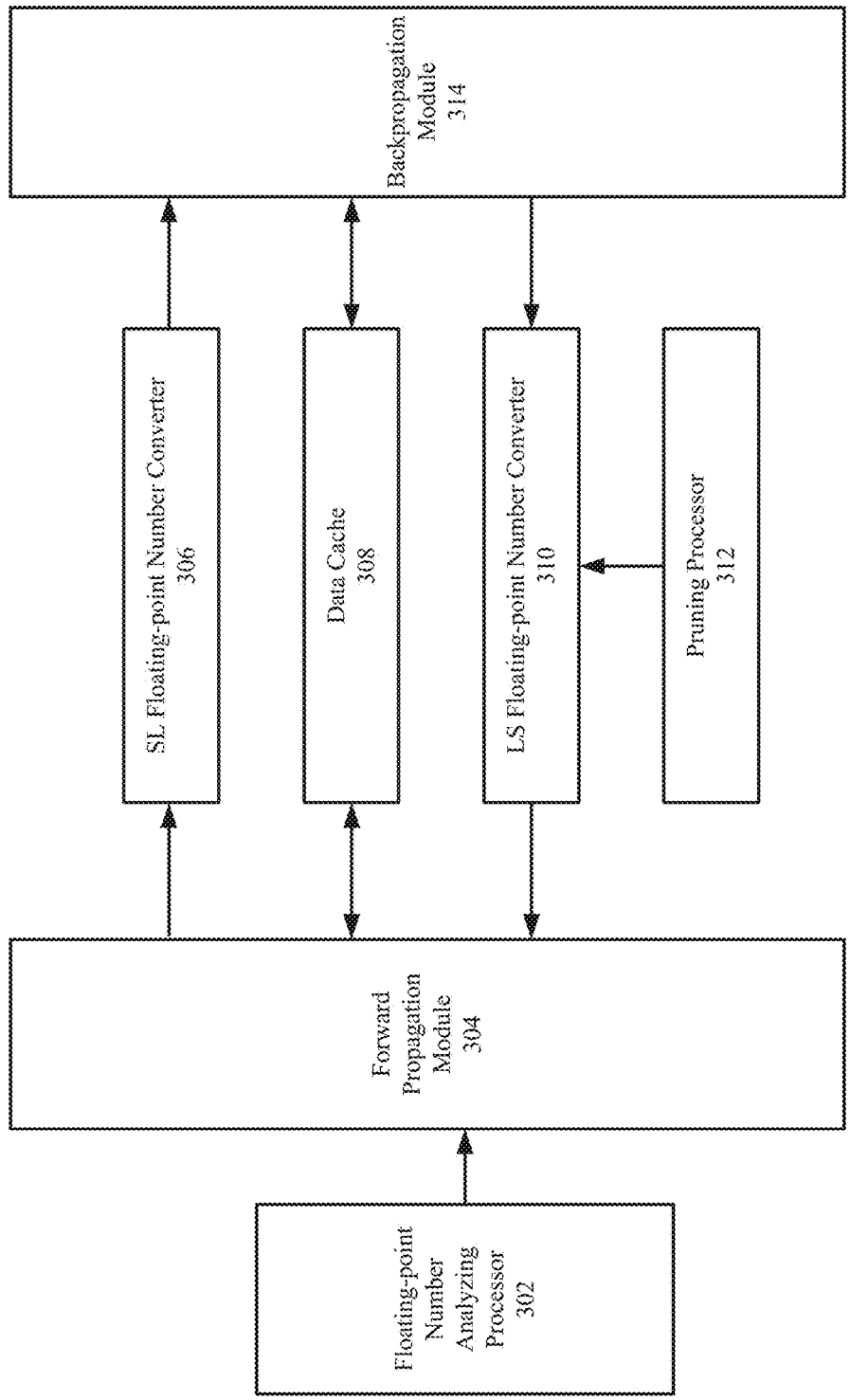
FIG. 3 is a block diagram illustrating an example device by which the example forward propagation process and the example backpropagation process may be implemented.

FIG. 3 is a block diagram illustrating an example device by which the example forward propagation process and the example backpropagation process may be implemented.

As depicted, a floating-point number analyzing processor 302 may be configured to collect the data involved or generated in different layers of the computing process 100. The data may be categorized based on the type and the layers. In other words, data of a same type in a same layer may be grouped together as a category.

Further, the floating-point number analyzing processor 302 may be configured to statistically analyze the categories of floating-point numbers to determine a distribution pattern of the data in each category over one or more data ranges.

For example, the floating-point number analyzing processor 302 may be configured to determine the distribution of the data in each category over a series of data ranges such as $[-2^{X-1-i}, 2^{X-1-i}-2^{-i}]$ i=0, 1, . . . , N, in which X represents the bit length of the fixed-point number and N represents a predetermined integer. Within each data range, a percentage of the total data may be determined. In some example, the bit length of the fixed-point number may be predetermined by a system administrator. The percentages in the data ranges may be respectively denoted as $p_0, p_1, \ldots, p_N$.

Further, the floating-point number analyzing processor 302 may determine a format of the fixed-point numbers based on the distribution. For example, floating-point number analyzing processor 302 may be configured to select a value i from 0 to N as the point location of the format of the fixed-point numbers, the percentage corresponding to the value i being equal to or greater than a predetermined threshold. That is, the value i may be determined as max$\{i | p_i \geq 1-\text{EPL}, i \in \{0, 1, \ldots, N\}\}$, in which EPL denotes a predetermined threshold.

According to the formats, the data for the forward propagation process may be converted and input to a forward propagation module 304. The forward propagation module 304 may be configured to perform operations in the forward propagation process. As described above, the operations may include multiplication or convolution between the input neuron data 102A and the weight values 102C. In some examples, the weight values 102C and bias values may not be converted into fixed-point numbers. Rather, the weight values 102C and the bias values may be stored in a data cache 308 as floating-point numbers for future backpropagation process.

During the forward propagation process, multiple intermediate results may be generated and temporarily stored in the data cache. In some examples, the intermediate results may be formatted as floating-point numbers and may be fed back to the forward propagation module 304 for further processing. In other words, the forward propagation module 304 may be capable of processing both floating-point numbers and fixed-point numbers.

The forward propagation process, when completed, may yield one or more process results, e.g., output neuron data 104A. According to the format determined for the type of data in a corresponding layer, the process results may be converted to fixed-point numbers.

The converted process results may be transmitted to a backpropagation module 314 for the backpropagation process. Prior to the backpropagation process, a SL floating-point number converter 306 may be configured to convert the process results to floating-point numbers.

Results of the backpropagation process may be transmitted to an LS floating-point number converter 310. The LS floating-point number converter 310, together with a pruning processor 312, may be configured to convert the results of the backpropagation process to fixed-point numbers.

Figure 4:
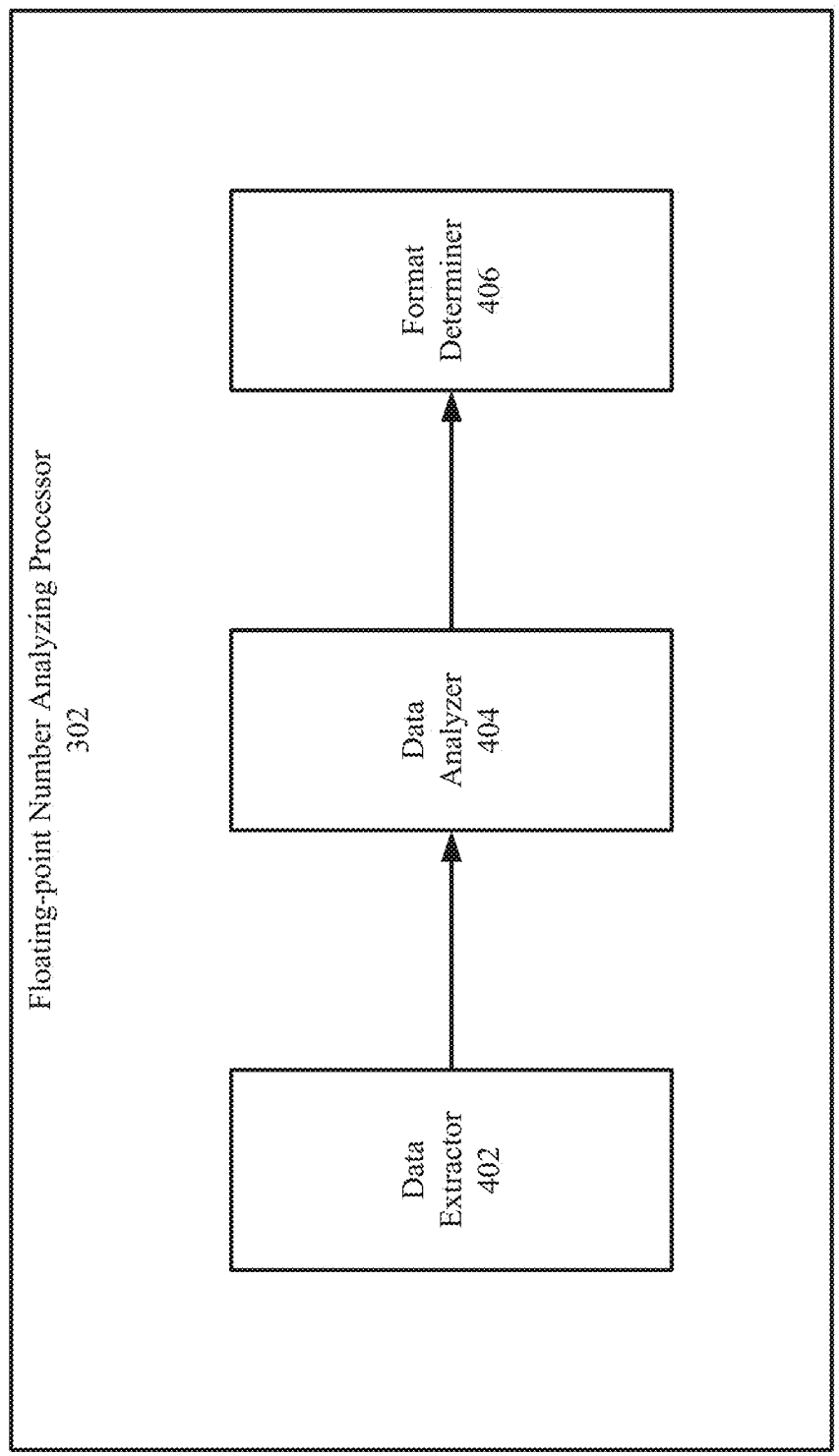
FIG. 4 is a block diagram illustrating an example floating-point number analyzing processor by which the example forward propagation process and the example backpropagation process may be implemented.

FIG. 4 is a block diagram illustrating an example floating-point number analyzing processor by which the example forward propagation process and the example backpropagation process may be implemented.

As depicted, the example floating-point number analyzing processor 302 may include a data extractor 402, a data analyzer 404, and a format determiner 406.

The data extractor 402 may be configured to collect involved or generated in different layers of the computing process 100. The data may be categorized or labeled based on the type and the layers. In other words, data of a same type in a same layer may be grouped together or labeled as a category.

The data analyzer 404 may be configured to statistically analyze the categories of floating-point numbers to determine a distribution pattern of the data in each category over one or more data ranges. For example, the data analyzer 404 may be configured to determine the distribution of the data in each category over a series of data ranges such as $[-2^{X-1-i}, 2^{X-1-i}-2^{-1}]$ i=0, 1, . . . , N, in which X represents the bit length of the fixed-point number and N represents a predetermined integer. Within each data range, a percentage of the total data may be determined. The percentages in the data ranges may be respectively denoted as $p_0, p_1, \ldots, p_N$.

The format determiner 406 may be configured to determine a format for each category of the data based on the distribution pattern of the data in each category. For example, the format determiner 406 may be configured to select a value i from 0 to N as the point location of the format of the fixed-point numbers, the percentage corresponding to the value i being equal to or greater than a predetermined threshold. That is, the value i may be determined as max$\{i | p_i \geq 1-\text{EPL}, i \in \{0, 1, \ldots, N\}\}$, in which EPL denotes a predetermined threshold.

Figure 5A:
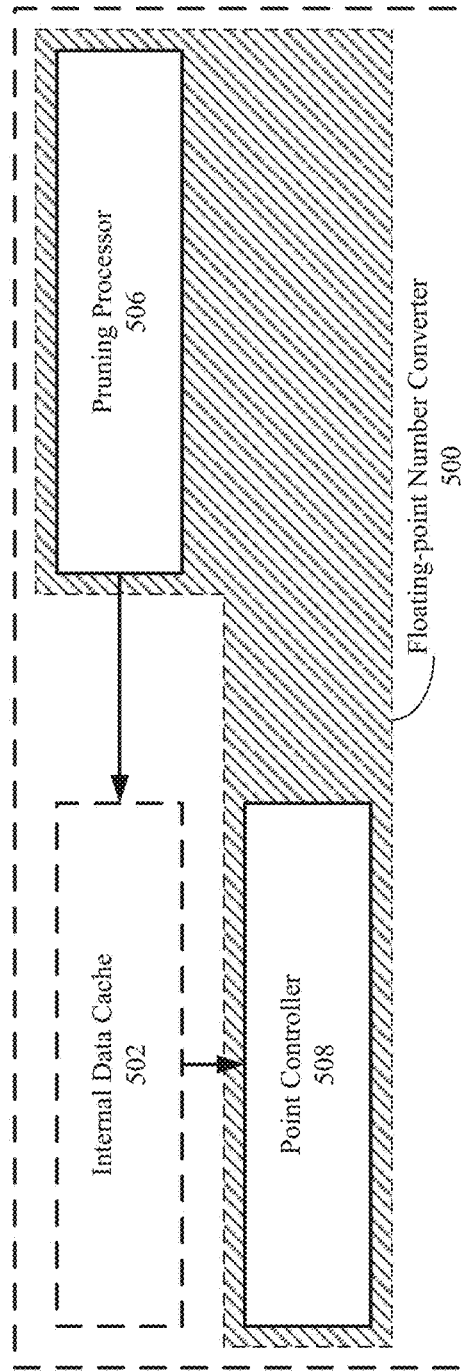
FIG. 5A is a block diagram illustrating an example forward propagation module by which the example forward propagation process may be implemented.

FIG. 5A is a block diagram illustrating an example forward propagation module by which the example forward propagation process may be implemented.

As depicted, the example forward propagation module may include an internal data cache 502 and a floating-point number converter 500. The internal data cache 502 may be configured to store one or more intermediate results generated during the forward propagation process. One or more process results of the forward propagation process may also be stored in the internal data cache 502.

The floating-point number converter 500 may include a pruning processor 506 and a point controller 508. The pruning processor 506 may be configured to adjust the mantissa field of the process results. In some examples, the intermediate results may not be affected by the pruning processor 506.

Further, the process results with the adjusted mantissa field may be transmitted to the point controller 508. As previously described, the process results may also be labeled or categorized into different category. With respect to one category of process results, the point controller 508 may be configured to set a binary point according to the point location included in the format corresponding to the category. As such, the process results of the forward propagation process may be converted to fixed-point numbers.

In the context of forward propagation process as illustrated by FIG. 1, the process results may be output to a next layer of operations as input data, e.g., input neuron data 106A.

Figure 5B:
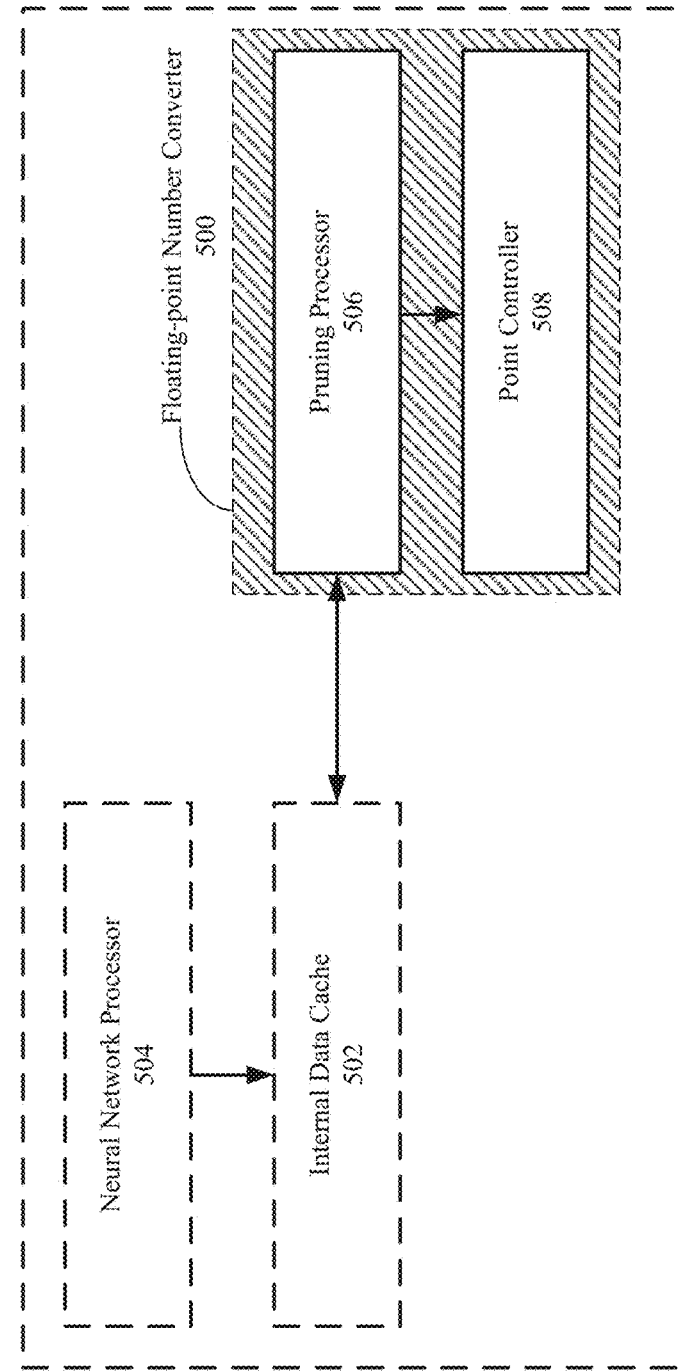
FIG. 5B is a block diagram illustrating another example forward propagation module by which the example forward propagation process may be implemented.

FIG. 5B is a block diagram illustrating another example forward propagation module by which the example forward propagation process may be implemented.

As depicted, the example forward propagation module may include a neural network processor 504 configured to perform neural network operations described in accordance with FIG. 1. Intermediate results and process results of the forward propagation process may be output to and temporarily stored in the internal data cache 502. The process results may be further transmitted to the pruning processor 506.

The pruning processor 506 may be configured to adjust the mantissa field of the process results. The process results with the adjusted mantissa field may be cached or temporarily stored in the internal data cache 502 or transmitted to the point controller 508 for further processing. With respect to one category of process results, the point controller 508 may be configured to set a binary point according to the point location included in the format corresponding to the category.

Figure 6:
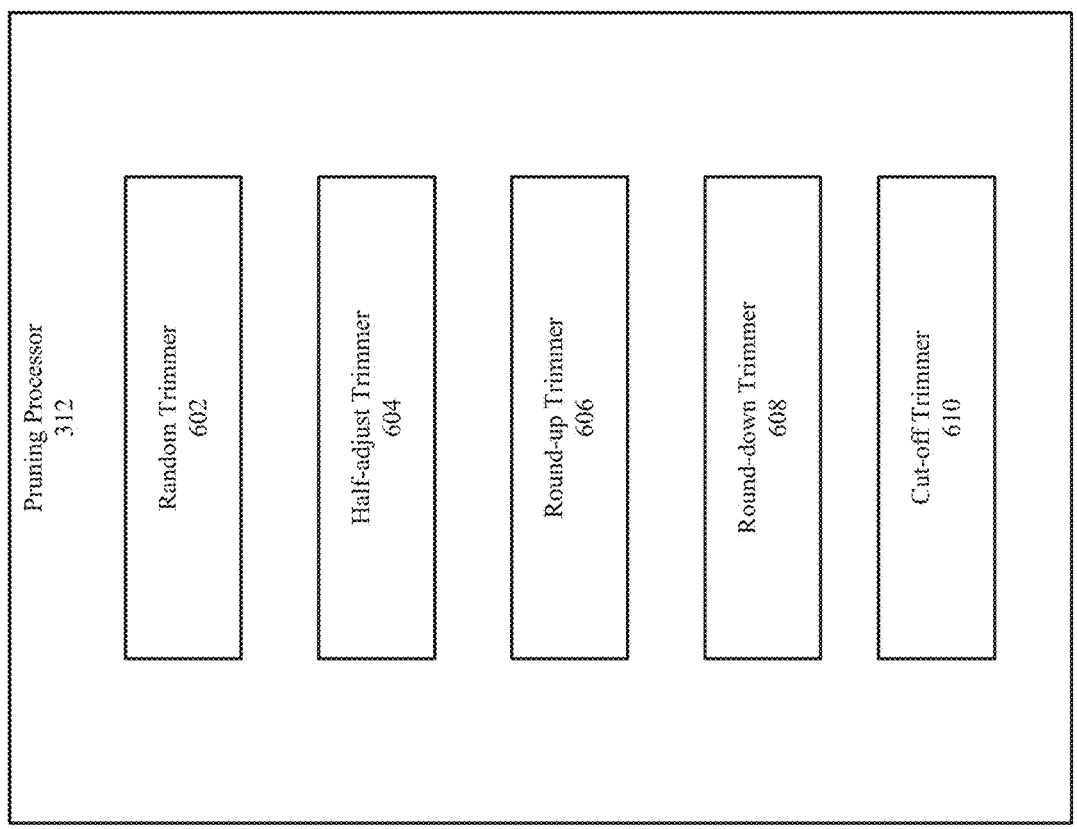
FIG. 6 is a block diagram illustrating an example pruning processor by which the example forward propagation process may be implemented.

FIG. 6 is a block diagram illustrating an example pruning processor by which the example forward propagation process may be implemented.

As depicted, the example pruning processor 312 may include one or more trimmers such as a random trimmer 602, a half-adjust trimmer 604, a round-up trimmer 606, a round-down trimmer 608, a cut-off trimmer 610, etc. The above trimmers may each include one or more bitwise assignment operators configured to manage the bits of floating-point numbers. The trimmers may be implemented by hardware, software, firmware, or any combination thereof.

The random trimmer 602 may be configured to adjust the length of the mantissa field of the process results to a first length in accordance with a first probability and adjust the length of the mantissa field of the process results to a second length in accordance with a second probability. For example, the random trimmer 602 may be configured to adjust the length of the mantissa field in accordance with the following equation:

$$y = \begin{cases} \lfloor x \rfloor & w.p. \ 1 - \frac{x - \lfloor x \rfloor}{\varepsilon} \\ \lfloor x \rfloor + \varepsilon & w.p. \ \frac{x - \lfloor x \rfloor}{\varepsilon} \end{cases},$$

in which y represents the adjusted mantissa, x represents the mantissa of the process results, ε represents a smallest positive integer that the format of the fixed-point numbers can represent, e.g., $2^{-Point\ Location}$, $\lfloor X \rfloor$ represents a mantissa obtained by selecting a number of most significant bits from the mantissa of the process results, the number of the most significant bits being the bit length of the adjusted mantissa field M', w.p. represents the probability of assigning a value as the adjusted mantissa. That is, the probability of assigning $\lfloor x \rfloor$ as the adjusted mantissa is $$1 - \frac{x - \lfloor x \rfloor}{\varepsilon}$$

and the probability of assigning $\lfloor x \rfloor + \varepsilon$ as the adjusted mantissa is $$\frac{x - \lfloor x \rfloor}{\varepsilon}.$$

The half-adjust trimmer 604 may be configured to add an integer value to the mantissa field if a fraction indicated by the mantissa field is not less than one-half of a smallest positive integer representable by the format of the fixed-point numbers, wherein the integer value is equal to the smallest positive integer representable by the format of the fixed-point numbers. If the fraction is less than one-half of the smallest positive integer representable by the format of the fixed-point numbers, the half-adjust trimmer 604 may be configured to clear the fraction indicated by the mantissa field of the process results. In some examples, the half-adjust trimmer 604 may be configured to adjust the mantissa of the process results in accordance with the following equation:

$$y = \begin{cases} \lfloor x \rfloor & \text{if } \lfloor x \rfloor \le x \le \lfloor x \rfloor + \frac{\varepsilon}{2} \\ \lfloor x \rfloor + \varepsilon & \text{if } \lfloor x \rfloor + \frac{\varepsilon}{2} \le x \le \lfloor x \rfloor + \varepsilon \end{cases},$$

in which y represents the adjusted mantissa, x represents the mantissa of the process results, ε represents a smallest positive integer that the format of the fixed-point numbers can represent, e.g., $2^{-Point\ Location}$, $\lfloor x \rfloor$ represents an integer multiple of ε, of which the value is the maximum number less than or equal to x.

The round-up trimmer 606 may be configured to round up the mantissa field to a smallest positive integer that is greater than the process result. For example, the round-up trimmer 606 may be configured to adjust the mantissa of the process results in accordance with the following equation: $y = \lceil x \rceil$, in which y represents the adjusted mantissa, x represents the mantissa of the process results, $\lceil x \rceil$ represents an integer multiple of ε, e.g., $2^{-Point\ Location}$. The value of $\lceil x \rceil$ is the minimum number greater than or equal to x.

The round-down trimmer 608 may be configured to round down the mantissa field to a greatest positive integer that is less than the process result. For example, the round-down trimmer 608 may be configured to adjust the mantissa of the process results in accordance with the following equation: $y = \lfloor x \rfloor$, in which y represents the adjusted mantissa, x represents the mantissa of the process results, $\lfloor x \rfloor$ represents an integer multiple of ε, e.g., $2^{-Point\ Location}$. The value of $\lfloor x \rfloor$ is the maximum number less than or equal to x.

The cut-off trimmer 610 may be configured to discard mantissa digits that exceed a length of a mantissa field in accordance with the at least one format of fixed-point numbers. In an example where the format of the fixed-point numbers indicates one or more bits for the fraction, the cut-off trimmer 610 may be configured to select one or more most significant bits from the mantissa of the process results. The count of the one or more most significant bits may be equal to the bit length of the fraction of the fixed-point number.

Figure 7:
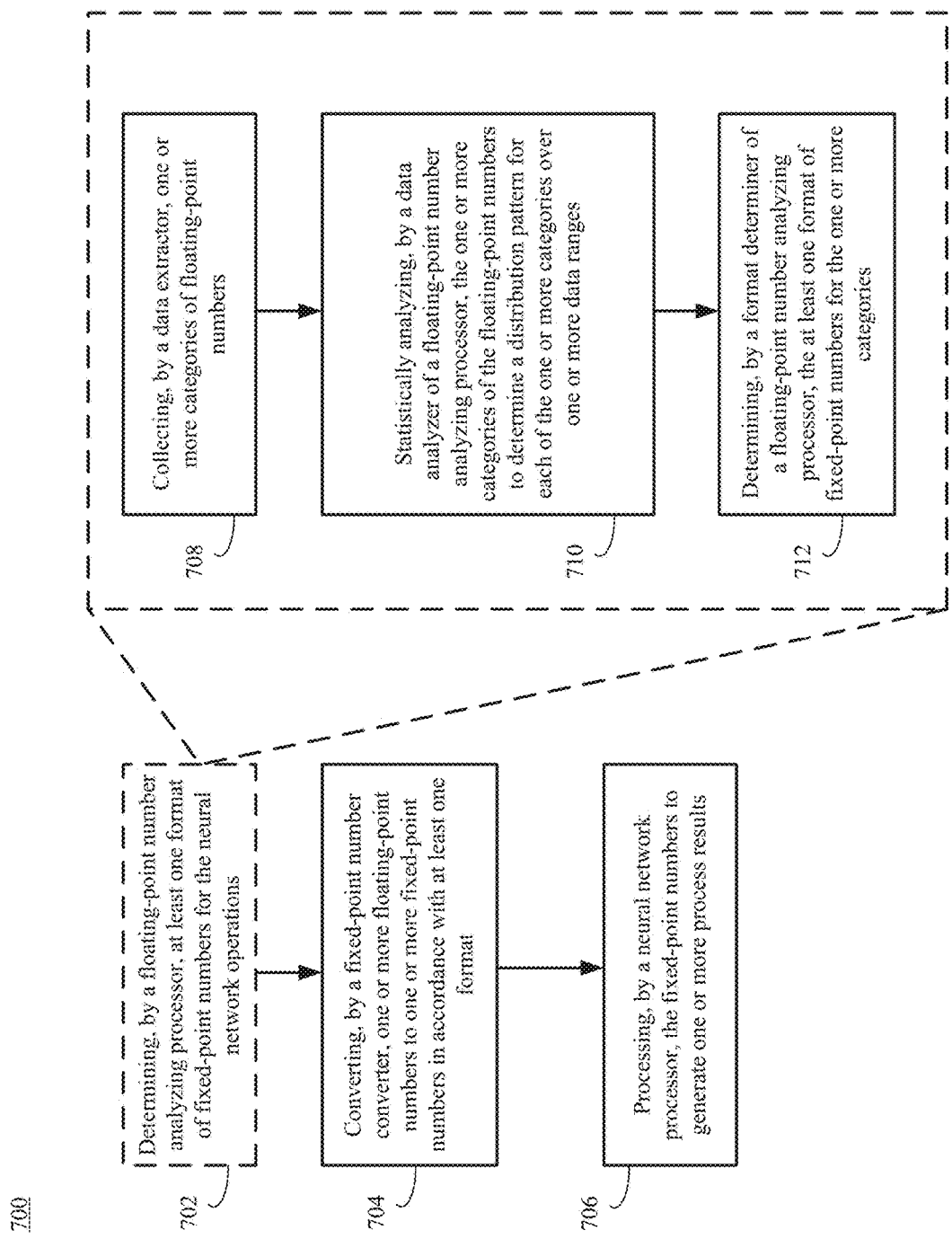
FIG. 7 is a flow chart illustrating an example method for converting floating-point numbers in a neural network.

FIG. 7 is a flow chart illustrating an example method for converting floating-point numbers in a neural network.

The example method 700 may be performed by one or more components described in accordance with FIGS. 3, 4, 5A, 5B, and 6. Optional operations may be indicated by dash-lined blocks.

At block 702, the example method 700 may optionally include determining at least one format of the fixed-point numbers. For example, the floating-point number analyzing processor 302 may be configured to determine a format for each category of the data involved in the forward propagation process. Block 702 may further include block 708, block 710, and block 712.

At block 708, the example method 700 may include collecting, by a data extractor of a floating-point number analyzing processor, one or more categories of floating-point numbers. For example, the data extractor 402 may be configured to collect involved or generated in different layers of the computing process 100. The data may be categorized or labeled based on the type and the layers. In other words, data of a same type in a same layer may be grouped together or labeled as a category.

At block 710, the example method 700 may include statistically analyzing, by a data analyzer of a floating-point number analyzing processor, the one or more categories of the floating-point numbers to determine a distribution pattern for each of the one or more categories over one or more data ranges. For example, the data analyzer 404 may be configured to statistically analyze the categories of floating-point numbers to determine a distribution pattern of the data in each category over one or more data ranges. For example, the data analyzer 404 may be configured to determine the distribution of the data in each category over a series of data ranges such as $[-2^{X-1-i}, 2^{X-1-i}-2^{-i}]$ i=0, 1, ..., N, in which X represents the bit length of the fixed-point number and N represents a predetermined integer. Within each data range, a percentage of the total data may be determined. The percentages in the data ranges may be respectively denoted as $p_0, p_1, \ldots, p_N$.

At block 712, the example method 700 may include determining, by a format determiner of a floating-point number analyzing processor, the at least one format of fixed-point numbers for the one or more categories. For example, the format determiner 406 may be configured to determine a format for each category of the data based on the distribution pattern of the data in each category. For example, the format determiner 406 may be configured to select a value i from 0 to N as the point location of the format of the fixed-point numbers, the percentage corresponding to the value i being equal to or greater than a predetermined threshold. That is, the value i may be determined as $\max\{i | p_i \geq 1-EPL, i \in \{0, 1, \ldots, N\}\}$, in which EPL denotes a predetermined threshold.

At block 704, the example method 700 may include converting, by a fixed-point number converter, one or more floating-point numbers to one or more fixed-point numbers in accordance with at least one format. Further, the converting may include adjusting, by a pruning processor, a length of a mantissa field of the process results and setting, by a point controller, a binary point to the process results in accordance with the at least one format.

For example, the pruning processor 506 may be configured to adjust the mantissa field of the process results and the point controller 508 may be configured to set a binary point according to the point location included in the format corresponding to the category. In more detail, the example pruning processor 312 may include one or more trimmers such as a random trimmer 602, a half-adjust trimmer 604, a round-up trimmer 606, a round-down trimmer 608, a cut-off trimmer 610, etc. The one or more trimmers are configured to adjust the mantissa of the process results.

At block 706, the example, method 700 may include processing, by a neural network processor, the fixed-point numbers to generate one or more process results. For example, a neural network processor 504 configured to perform neural network operations described in accordance with FIG. 1.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described herein that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

We claim:

1. An apparatus for neural network operations, comprising:
   a fixed-point number converter configured to convert one or more first floating-point numbers to one or more first fixed-point numbers in accordance with at least one format;
   a neural network processor configured to process the first fixed-point numbers to generate one or more process results, and
   a floating-point number analyzing processor configured to determine the at least one format of fixed-point numbers, wherein the floating-point number analyzing processor includes:
      a data extractor configured to collect one or more categories of the first floating-point numbers;
      a data analyzer configured to statistically analyze the one or more categories of the first floating-point numbers to determine a distribution pattern for each of the one or more categories over one or more data ranges; and
      a format determiner configured to determine the at least one format of fixed-point numbers for the one or more categories.

2. The apparatus of claim 1, wherein the format determiner is configured to determine one of the at least one format of fixed-point numbers for each of the one or more categories.

3. The apparatus of claim 1, wherein each of the at least one format includes a point location that indicates a location of the binary point.

4. The apparatus of claim 1, further comprising a data cache configured to store the one or more process results.

5. The apparatus of claim 1, wherein the fixed-point number converter includes:
   a pruning processor configured to adjust a length of a mantissa field of the first floating-point numbers; and
   a point controller configured to set a binary point to the first floating-point numbers in accordance with the at least one format.

6. The apparatus of claim 5, wherein the pruning processor includes a random trimmer configured to adjust the length of the mantissa field of the first floating-point numbers to a first length in accordance with a first probability; and adjust the length of the mantissa field of the first floating-point numbers to a second length in accordance with a second probability.

7. The apparatus of claim 5, wherein the pruning processor includes a half-adjust trimmer configured to:

add an integer value to the mantissa field if a fraction indicated by the mantissa field is not less than one-half of a smallest positive integer representable by the format of fixed-point numbers, wherein the integer value is equal to the smallest positive integer representable by the format of fixed-point numbers; and clear the fraction indicated by the mantissa field if the fraction is less than one-half of the smallest positive integer representable by the format of fixed-point numbers.

8. The apparatus of claim 5, wherein the pruning processor includes a round-up trimmer configured to round up the mantissa field to a smallest positive integer that is greater than the first floating-point number.

9. The apparatus of claim 5, wherein the pruning processor includes a round-down trimmer configured to round down the mantissa field to a greatest positive integer that is less than the first floating-point number.

10. The apparatus of claim 5, wherein the pruning processor includes a cut-off trimmer configured to discard mantissa digits that exceed a length of a mantissa field in accordance with the at least one format of fixed-point numbers.

11. The apparatus of claim 1, further comprising:

a SL floating-point number converter configured to convert the one or more process results to one or more second floating-point numbers;

a backpropagation module configured to process the one or more second floating-point numbers to generate one or more backpropagation results; and a LS floating-point number converter configured to convert the one or more backpropagation results to one or more second fixed-point numbers.

12. A method for neural network operations, comprising:

converting, by a fixed-point number converter, one or more first floating-point numbers to one or more first fixed-point numbers in accordance with at least one format;

processing, by a neural network processor, the first fixed-point numbers to generate one or more process results, and collecting, by a data extractor of a floating-point number analyzing processor, one or more categories of the first floating-point numbers;

statistically analyzing, by a data analyzer of a floating-point number analyzing processor, the one or more categories of the first floating-point numbers to determine a distribution pattern for each of the one or more categories over one or more data ranges; and determining, by a format determiner of a floating-point number analyzing processor, the at least one format of fixed-point numbers for the one or more categories.

13. The method of claim 12, further comprising determining, by the format determiner, one of the at least one format of fixed-point numbers for each of the one or more categories.

14. The method of claim 12, wherein each of the at least one format includes a point location that indicates a location of the binary point.

15. The method of claim 12, further comprising adjusting, by a pruning processor of the fixed-point number converter, a length of a mantissa field of the first floating-point numbers; and setting, by a point controller of the fixed-point number converter, a binary point to the first floating-point numbers in accordance with the at least one format.

16. The method of claim 15, wherein the adjusting the length of the mantissa field further comprises:

adjusting, by a random trimmer of the pruning processor, the length of the mantissa field of the first floating-point numbers to a first length in accordance with a first probability; and adjusting, by the random trimmer of the pruning processor, the length of the mantissa field of the first floating-point numbers to a second length in accordance with a second probability.

17. The method of claim 15, wherein the adjusting the length of the mantissa field further comprises:

adding, by a half-adjust trimmer of the pruning processor, one to a second least significant bit of the mantissa field if a least significant digit is not less than one-half of a smallest positive integer representable by the format of fixed-point numbers; and clearing, by the half-adjust trimmer of the pruning processor, the least significant digit if the least significant digit is less than one-half of a smallest positive integer representable by the format of fixed-point numbers.

18. The method of claim 15, wherein the adjusting the length of the mantissa field further comprises rounding up, by a round-up trimmer of the pruning processor, the mantissa field to a smallest positive integer that is greater than the first floating-point number.

19. The method of claim 15, wherein the adjusting the length of the mantissa field further comprises rounding down, by a round-down trimmer, the mantissa field to a greatest positive integer that is less than the first floating-point number.

20. The method of claim 15, wherein the adjusting the length of the mantissa field further comprises discarding, by a cut-off trimmer, exponent digits that exceed a length of the mantissa field in accordance with the at least one format of fixed-point numbers.

21. The method of claim 12, further comprising storing, by a data cache, the one or more process results.

22. The method of claim 12, further comprising:

converting, by a SL floating-point number converter, the one or more process results to one or more second floating-point numbers;

processing, by a backpropagation module, the one or more second floating-point numbers to generate one or more backpropagation results; and converting, by a LS floating-point number converter, the one or more backpropagation results to one or more second fixed-point numbers.

* * * * *